United States Patent [19]
Trimberger

[11] Patent Number: 5,986,467
[45] Date of Patent: Nov. 16, 1999

[54] TIME-MULTIPLEXED PROGRAMMABLE LOGIC DEVICES

[75] Inventor: Stephen M. Trimberger, San Jose, Calif.

[73] Assignee: Xilinx, Inc., San Jose, Calif.

[21] Appl. No.: 08/960,558

[22] Filed: Oct. 31, 1997

[51] Int. Cl.[6] ....................................................... G06F 7/38
[52] U.S. Cl. .................................. 326/40; 326/38; 326/39
[58] Field of Search .................................. 326/38, 39, 40

[56] References Cited

U.S. PATENT DOCUMENTS

| | | | |
|---|---|---|---|
| 5,338,982 | 8/1994 | Kawana | 307/465 |
| 5,426,378 | 6/1995 | Ong | 326/39 |
| 5,646,545 | 7/1997 | Trimberger et al. | 326/38 |
| 5,764,076 | 6/1998 | Lee et al. | 326/38 |

OTHER PUBLICATIONS

An Application Note by Wilkie, Bill, entitled, "Interfacing XC6200 to Microprocessors (MC68020 Example)," Sep. 1995, available from Xilinx Inc., 2100 Logic Drive, San Jose, California 95124.

"The Programmable Logic Data Book" copyright 1996, Xilinx, Inc., 2100 logic Drive, San Jose, CA 95124.

*Primary Examiner*—David Nelms
*Assistant Examiner*—Tuan T. Nguyen
*Attorney, Agent, or Firm*—Arthur J. Behiel; Edel M. Young

[57] ABSTRACT

Described are a method and circuit for time-multiplexing two or more PLDS. The invention allows a pair of PLDs to sequentially perform more than two logic functions. The PLDs share common input and output nodes. The output nodes of each PLD may be tri-stated so that either PLD can be active (i.e., perform some logic function) at any given instant without logic conflicts on the common output nodes. A configurable-logic modification (CLM) circuit determines which PLD is active. The CLM circuit can selectively modify the logical configuration of one PLD while the other PLD actively performs some logical operation and provides the result of that logical operation on the common output nodes. The CLM circuit can then deactivate the active PLD and activate the newly configured second PLD to implement the second logic function. The formerly active PLD, now inactive, may then be reconfigured to perform yet another logical operation while the second PLD actively performs the second logical operation and provides the result of that logical operation on the common output nodes.

22 Claims, 2 Drawing Sheets

TIME-MULTIPLEXED PROGRAMMABLE LOGIC DEVICES

FIELD OF THE INVENTION

This invention relates generally to programmable logic devices, and in particular to a system of programmable logic devices that may be reconfigured dynamically.

BACKGROUND

Programmable logic devices (PLDs) are a well-know type of digital integrated circuit that may be programmed by a user (e.g., a circuit designer) to perform specified logic functions. PLDs are becoming ever more popular, largely because they are less expensive and require less time to implement than semi-custom and custom integrated circuits.

One type of PLD, the field-programmable gate array (FPGA), typically includes an array of configurable logic blocks, or CLBs, that are programmably interconnected to each other and to programmable input/output blocks (IOBs). This collection of configurable logic may be customized by loading configuration data into internal configuration memory cells that define how the CLBs, interconnections, and IOBs are configured. The configuration data may be read from memory (e.g., an external PROM) or written into the FPGA from an external device. The collective states of the individual memory cells then determine the function of the FPGA.

FPGAs can be reconfigured any number of times by simply reprogramming the configuration memory cells. Some FPGA applications take advantage of this feature by providing a number N of sets of configuration memory, each of which may be programmed to store a different set of configuration data. The FPGA may then be easily and quickly reprogrammed to function in one of N configurations. On the other hand, for an FPGA that has only one set of configuration memory, complex logic functions can be implemented by reconfiguring the FPGA to sequentially perform more than one logic function on a given set of input signals.

Unfortunately, each FPGA reconfiguration may require some or all of the following:

1. suspending the implementation of logic functions;
2. loading a new bitstream of configuration data into an array of memory configuration cells in the FPGA;
3. applying the saved state of the previous logic functions;
4. allowing the logic levels of the newly reconfigured FPGA to settle to ensure valid data on the output pins before resuming operation; and
5. saving the current state of the logic functions (e.g., saving the output levels of previous functions).

These steps are collectively time consuming, especially in applications that require frequent reconfiguration.

A partial solution to this speed problem involves integrating into a single chip or die the reconfiguration memory and read/write control circuitry associated with the FPGA. For a more detailed description of such a device, see U.S. Pat. No. 5,646,545, entitled "Time Multiplexed Programmable Logic Device," issued Jul. 8, 1997, which is incorporated herein by reference.

Integrating the configuration memory and read/write control circuitry with the FPGA solves many problems associated with dynamic reconfiguration. However, there is still substantial room for improvement. For example, settling time can still impose a substantial delay in applications that require frequent reconfiguration. Moreover, the reconfiguration memory and associated read/write control circuitry occupy a large percentage of available chip area. In one example having eight alternative configurations, the additional memory and resources increase the area of the FPGA by a factor of three. Increasing the area is expensive and slows the logic function of the FPGA. Finally, reading hundreds of thousands of memory locations, as is required for a typical reconfiguration, consumes substantial power. The resulting heat can adversely affect reliability and speed performance.

Also, some FPGAs must go into a configuration mode while being configured. If only a small part of the device is being configured, this time can be small, but it must be accounted for nevertheless, and therefore any reconfiguration causes a disruption in the device operation while the reconfiguration is taking place.

SUMMARY

The present invention is directed to a method and system for time-multiplexing two or more PLDs. In a system that includes two PLDs, for example, the PLDs "take turns" performing selected logic operations; the active PLD performs the logic operation so that the inactive PLD can undergo the time-consuming task of reconfiguration without interrupting the logic operation of the system. Then, once the inactive PLD is fully reconfigured, the system can switch between PLDs to perform the second function. The previously active PLD, now inactive, can then be reprogrammed to perform yet another logic operation. In this way, a number N of PLDs can perform M logic functions, where M may be greater than N, while avoiding many of the problems associated with the prior art.

One system in accordance with the invention includes a pair of PLDs (i.e., N=2) with common input and output terminals. Each PLD is configured to include tri-state output nodes. That is, each output node can output a logic one, a logic zero, or a high impedance. The inactive PLD is tri-stated (i.e., a high impedance) to avoid conflicts between the active and inactive PLDs on the common output terminals. The system also includes a configurable-logic modification (CLM) circuit configured to selectively modify the logical configuration of the inactive PLD while the other PLD actively performs some logical operation.

One embodiment of the invention functions as follows. First, the CLM circuit loads a set of configuration data from a configuration memory into the first PLD. The output nodes of both PLDs are tri-stated during this first configuration sequence. Next, the CLM circuit activates the first PLD by connecting the output nodes of the first PLD to the output terminals of the system. Thus connected, the first PLD then provides some logical function of the input signals on the output terminals. During this time, the second PLD is also connected to the input terminals and may therefore perform some logic operation on the signals from the input terminals; however, any such operation is of no consequence because the output nodes of the second PLD are tri-stated.

At any time during the operation of the first PLD the system can receive an instruction to prepare to perform a second logic operation. The CLM circuit responds by loading the second, inactive PLD with a second set of configuration data from the configuration memory. The second set of configuration data is selected to perform the second logic operation. Once the second PLD is configured, the CLM circuit can deactivate the first PLD and activate the second PLD so that the system performs the second logic function.

Once the second PLD is active and the first inactive, the first PLD can be reconfigured to perform yet another logical operation; the CLM circuit can then switch active devices once again to implement the new function. In this way, the two PLDs can sequentially perform any number of logical operations.

Some logical operations rely upon "state data" from a preceding logic function. State data represents the logical values of nodes in a programmable logic device at any specific time. State data is used, for example, when a logical operation requires as input a result from a previous operation. One embodiment of the invention supports the sharing of state data with a bi-directional bus connected between PLDs. The CLM circuit controls the transfer of state data.

DETAILED DESCRIPTION

Figure 1:
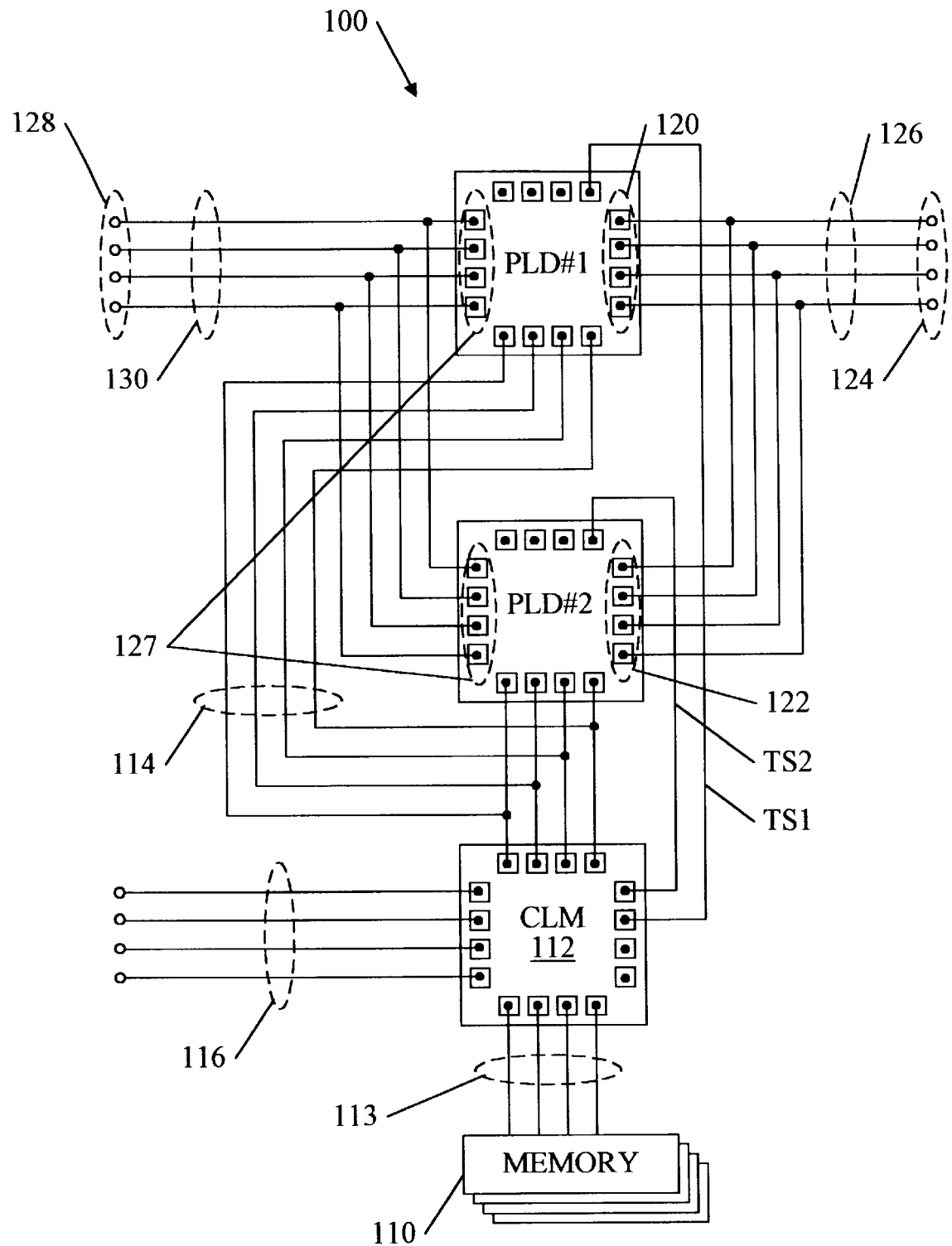
FIG. 1 depicts a system 100 that includes a pair of time-multiplexed programmable logic devices PLD#1 and PLD#2.

FIG. 1 depicts a system 100 in accordance with the present invention that includes a pair of time-multiplexed programmable logic devices PLD#1 and PLD#2. Programmable logic devices PLD#1 and PLD#2 are connected in parallel (having common input and output nodes) so that either one may be selected to perform a specific logic function while the other remains inactive. For example, PLD#1 may be active while the output nodes of PLD#2 are tri-stated (electrically disconnected).

Time multiplexing PLD#1 and PLD#2 advantageously allows the time-consuming task of reconfiguration to be accomplished on the inactive device while the active device performs some useful function. Then, once the inactive device is fully reconfigured, system 100 can switch between programmable logic to perform the second function. For example, if PLD#1 were active and PLD#2 tri-stated prior to switching, then PLD#2 would be active and PLD#1 tri-stated after switching. PLD#1, now the inactive device, can then be reconfigured while system 100 implements the newly configured logic function of PLD#2.

Configuring (or reconfiguring) PLD#1 or PLD#2 includes loading different sets of configuration data from configuration memory 110 into the selected PLD. This configuration process is controlled by a configurable-logic modification (CLM) circuit 112, which reads configuration data from configuration memory 110 over a bus 113 and conveys the configuration data to the selected PLD via an address and data bus 114. These configuration operations are accomplished by conventional means that are well within the skill of those familiar with configuring PLDs.

PLD#1 and PLD#2 are, in one embodiment, XC4062XL FPGAs available from Xilinx, Inc., of San Jose, Calif. CLM circuit 112 may also be a PLD, and is in one embodiment a Xilinx XC4013E or XC4020E FPGA programmed to perform the function described below in connection with FIG. 2. Larger capacity FPGAs such as the Xilinx XC4036 may also be used for CLM circuit 112 where additional functionality is desired.

CLM circuit 112 receives commands on a bus 116 from an external control source (not shown), such as a microprocessor or network. Incidentally, the four-line buses of FIG. 1 are illustrative; in practice, there are typically many more lines in a given bus. In one embodiment, bus 116 is a conventional PCI bus, which is to say that bus 116 and associated interface circuitry conform to the Process Control Interface (PCI) standard. Programming an FPGA such as the Xilinx XC6200 to interface with a conventional bus standard is well within the skill of those in the art. A 1995 Xilinx Application Note entitled "Interfacing XC6200 to Microprocessors (MC68020 Example)" offers an example of an XC6200 FPGA interfaced with a MC68020 microprocessor available from Motorola. That Application Note is incorporated herein by reference.

PLD#1 and PLD#2 each conventionally include a group of programmable input/output blocks (IOBs) that may be configured as tri-state output nodes. That is, the output node of each IOB can be configured to support three possible output signals, a logic one, a logic zero, or a high impedance. The groups of tri-state output nodes associated with PLD#1 and PLD#2 are connected in parallel to a collection of output terminals 124 via an output bus 126. PLD#1 and PLD#2 also include respective groups of conventional programmable input/output blocks (IOBs) 127 configured as input nodes. These groups of input nodes are connected in parallel to a collection of input terminals 128 via an input bus 130.

CLM circuit 112 is connected to PLD#1 and PLD#2 via address and data bus 114 and respective tri-state control lines TS1 and TS2. CLM circuit 112 determines which PLD output nodes 120 or 122 are tri-stated, asserting TS1 to tri-state PLD#1 or TS2 to tri-state PLD#2. CLM therefore determines which of PLD#1 and PLD#2 controls the voltage levels on output terminals 124.

Configuration memory 110, conventional DRAM in one embodiment, stores a plurality of sets of configuration data, the number of sets in a system typically being greater than the number of PLDs. In one embodiment that includes two PLDs, for example, configuration memory 110 can store as many as eight sets of configuration data. Thus, that embodiment can sequentially perform as many as eight logic operations using only two PLDs.

Some operations rely upon "state data" from a preceding logic function. State data is data defining the logical values of nodes in a programmable logic device at any specific time. In one embodiment, PLD#1 and PLD#2 store state data in flip flops for use at a later time. For example, the output from a function defined by a first set of configuration data may be used as input data for a subsequent function defined by a second set of configuration data. For such operations, the state data from the PLD performing the first function is loaded into the PLD that is to perform the subsequent function. In the embodiment of FIG. 1, address-and-data bus 114 is configured to convey state data between PLD#1 and PLD#2. Alternatively, state data may be stored in memory 110 for use in functions that do not immediately follow the function in which the state data was derived.

Figure 2:
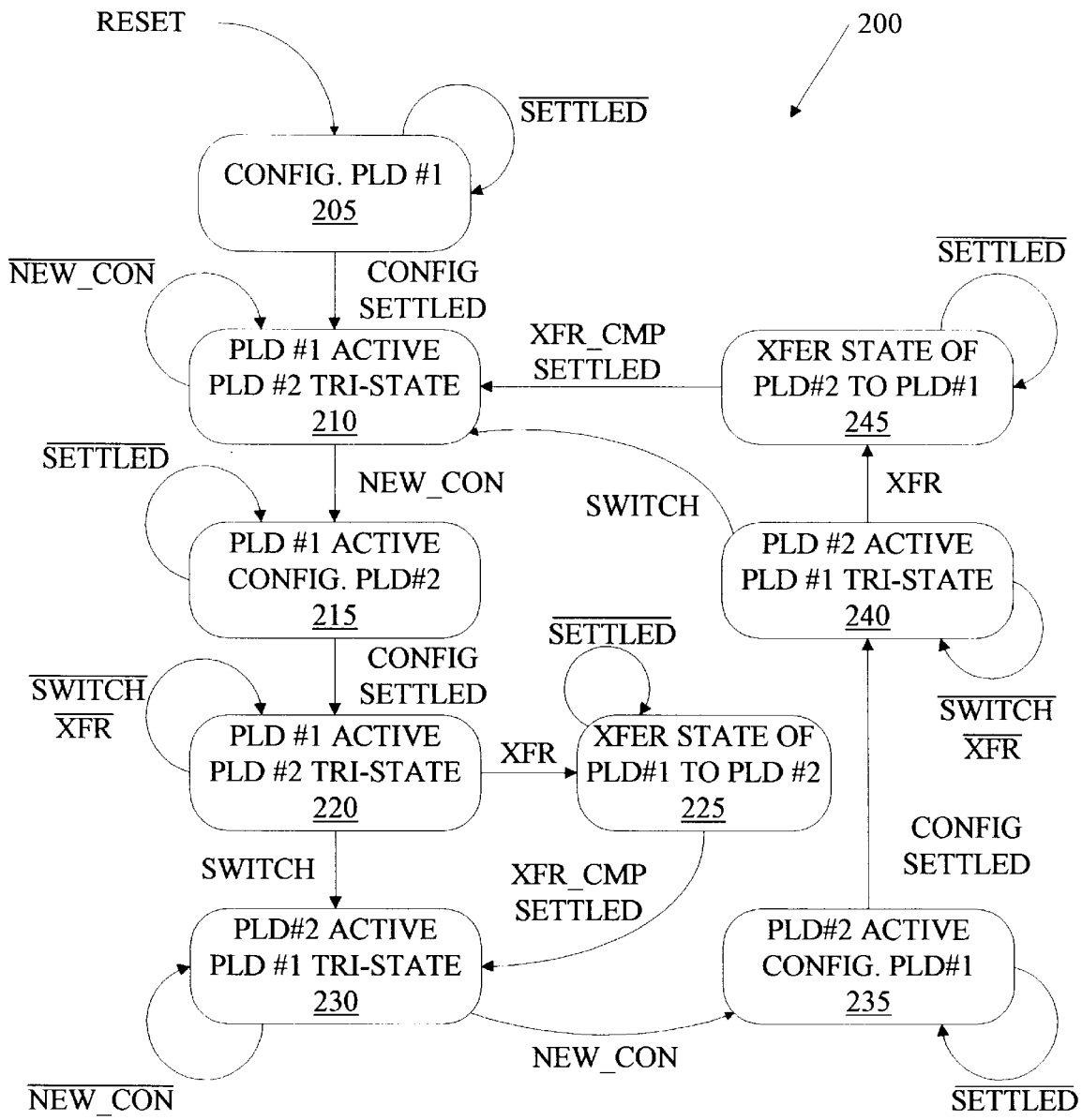
FIG. 2 is a simplified state diagram 200 illustrating the operation of the time-multiplexed PLD system 100 of FIG. 1.

FIG. 2 is a simplified state diagram 200 illustrating the operation of the time-multiplexed PLD system 100 of FIG. 1. The signals depicted are illustrative, and do not necessarily correspond with actual signals in a particular embodiment. The Xilinx, Inc., 1996 publication entitled "The Programmable Logic Data Book" provides sufficient detail to enable one of skill in the art to implement the functionality described in FIG. 2 using programmable logic devices available from Xilinx, Inc. That Data Book is therefore incorporated herein by reference. Other programmable logic devices may also be used, as will be apparent to those of skill in the art.

System 100 begins in state 205 whenever system 100 is reset (RESET). CLM circuit 112 conventionally configures PLD#1 with a selected set of configuration data from configuration memory 110, the set selected depending upon control signals received over bus 116. During state 205, signals on lines TS1 and TS2 tri-state the output nodes of both PLD#1 and PLD#2. After PLD#1 is configured, to ensure valid output data, CLM 112 keeps output nodes 120 tri-stated until the output signals have had ample settling time (e.g., 100 ns). After PLD#1 is configured (CONFIG) and settled (SETTLED), system 100 moves to state 210.

PLD#1 is "active" in state 210, which means that PLD#1 can perform a logical operation on the input signals on input terminals 128 and provide the results of the operation on output terminals 124. PLD#2 is also connected to input terminals 128 and may therefore perform some logic operation on the signals from input terminals 128; however, any such operation is of no consequence in state 210 because output nodes 122 are tri-stated.

System 100 remains in state 210 until CLM 112 receives a signal NEW_CON instructing system 100 to prepare to perform a second logic operation by receiving a new set of configuration data. CLM 112 then moves to state 215 and configures PLD#2 with a set of configuration data from memory 110 selected to perform the second logic operation. CLM 112 then moves to state 220 after the newly configured PLD#2 is settled.

CLM 112 remains in state 220 until instructed either to switch to the second configuration (SWITCH) or to transfer state data representative of the current state of PLD#1 to PLD#2 (XFR). In one embodiment, CLM 112 suspends the operation of both PLD#1 and PLD#2 during the state-data transfer. Also during the transfer, CLM 112 moves to state 225 and issues a tri-state command on lines TS1 and TS2 causing PLD#1 and PLD#2 to tri-state their respective output nodes 120 and 122. In another embodiment, PLD#1 may continue to drive outputs during the data transfer, in which case only PLD#2 has tri-stated outputs. CLM 112 then transfers the state data between PLD#1 and PLD#2 over address and data bus 114. Once the transfer of state data is completed (XFR_CMP) and PLD#2 has been afforded sufficient settling time to ensure stable output signals on output terminals 124 (SETTLED), CLM 112 moves to state 230.

The operation of the remaining states 235, 240, and 245 is similar to the operation of respective states 215, 220, and 225, the only difference being that the roles of PLD#1 and PLD#2 are reversed: instead of configuring and activating PLD#2, states 235, 240, and 245 configure and activate PLD#1. Because the operation of states 235, 240, and 245 is similar to the operation of states 215, 220, and 225, a description of states 235, 240, and 245 is omitted for brevity.

While the present invention has been described in connection with specific embodiments, variations of these embodiments will be obvious to those of ordinary skill in the art. For example, 1. The logical operation of system 100 can be extended to include three or more PLDs.
2. PLD#1, PLD#2, and CLM 112 can be implemented as a single integrated circuit on a single chip, or die.
3. Each of PLD#1 and PLD#2 can be replaced with multiple interconnected FPGAs.
4. PLD#1 and PLD#2 may be different devices with identical pinout.
5. CLM 112 may be implemented as a custom device, which would lower cost for large volumes.
6. Memory may be integrated into CLM 112.
7. Memory may be accessed over bus 116.
8. Bus 116 may be a very simple interface—potentially a single wire that selects PLD#1 when low and PLD#2 when high, for example.
9. Selection of the active output port may be made by a multiplexer external to PLD#1 and PLD#2 rather than by tristate control signals.
10. Dedicated buses 130, 114, 116, and 126 and the multiplexer mentioned in item 9 above may be formed from programmable routing resources of an FPGA.

Moreover, some components are shown directly connected while others are shown connected via intermediate components. In each instance the method of interconnection establishes some desired electrical communication between two or more circuit nodes. Such communication may generally be accomplished using a number of circuit configurations, as will be understood by those of skill in the art. Therefore, the spirit and scope of the appended claims should not be limited to the foregoing description.

What is claimed is:

1. A system comprising:
    a. a first programmable logic structure including:
        i. a first set of configuration memory cells;
        ii. a first tri-state output node;
        iii. a first collection of configurable logic connected to the first tri-state output node;
        iv. wherein the first collection of configurable logic is capable of implementing a plurality of logic functions, each logic function being defined by a first set of configuration data loaded into the first set of configuration memory cells;
    b. a second programmable logic structure including:
        i. a second set of configuration memory cells;
        ii. a second tri-state output node;
        iii. a second collection of configurable logic connected to the second tri-state output node;
        iv. wherein the second collection of configurable logic is capable of implementing a plurality of logic functions, each logic function being defined by a second set of configuration data;
    c. an output terminal connected to each of the first and second tri-state output nodes so that the first and second tri-state output nodes can each, in turn, provide on the output terminal an output signal from the respective first and second programmable logic structures; and
    d. a configurable-logic modification circuit configured to load a third set of configuration data into the first set of configuration memory cells while the second programmable logic structure operates in an active state to implement one of the plurality of logic functions, thereby providing a result of the one logic function on the output terminal.

2. The system of claim 1, further comprising a bi-directional bus connected between the first and second programmable logic structures, thereby enabling the first and second programmable logic structures to convey state data bi-directionally between the first and second programmable logic structures.

3. The system of claim 1, wherein the first and second programmable logic structures comprise field-programmable gate arrays.

4. The system of claim 1, wherein the first programmable logic structure comprises the first tri-state output node.

5. The system of claim 1, wherein the first and second programmable logic structures are implemented on a single die.

6. The system of claim 5, wherein the configurable-logic modification circuit is implemented on the single die.

7. The system of claim 1, further comprising an address bus connected between the configurable-logic modification circuit and at least one of the first and second programmable logic structures.

8. The system of claim 1, wherein the configurable-logic modification circuit comprises a PLD.

9. A method of time-multiplexing first and second collections of configurable logic, the method comprising:
   a) connecting tri-state output terminals of the first collection of configurable logic to respective tri-state output terminals of the second collection of configurable logic;
   b) loading a first set of configuration data into the first collection of configurable logic;
   c) tri-stating the output terminals of the second collection of configurable logic;
   d) activating the first collection of configurable logic to perform a first logic function defined by the first set of configuration data;
   e) loading a second set of configuration data into the second collection of configurable logic while the first collection of configurable logic performs the first logic function;
   f) tri-stating the output terminals of the first collection of configurable logic; and
   g) activating the second collection of configurable logic to perform the second logic function defined by the second set of configuration data.

10. The method of claim 9, further comprising connecting input terminals of the first collection of configurable logic to respective input terminals of the second collection of configurable logic.

11. The method of claim 9, further comprising loading state information from the first collection of configurable logic to the second collection of configurable logic before activating the second collection of configurable logic to perform the second logic function.

12. The method of claim 9, further comprising locating the first and second collections of configurable logic on a single programmable logic device.

13. A system comprising:
   a) a first collection of configurable logic having a first output node;
   b) a first set of configuration memory cells connected to the first collection of configurable logic;
   c) wherein the first collection of configurable logic is capable of implementing a plurality of logic functions, each logic function being defined by one of a plurality of sets of configuration data loaded into the first set of configuration memory cells;
   d) a second collection of configurable logic having a second output node;
   e) a second set of configuration memory cells connected to the second collection of configurable logic;
   f) wherein the second collection of configurable logic is capable of implementing a plurality of logic functions, each logic function being defined by a second one of the plurality of sets of configuration data loaded into the second set of configuration memory cells;
   g) an output terminal connected to each of the first and second collections of configurable logic so that the first and second output nodes can each, in turn, provide on the output terminal an output signal from the respective first and second collections of configurable logic; and
   h) a configurable-logic modification circuit configured to load a third one of the plurality of sets of configuration data into the first set of configuration memory cells while the second collection of configurable logic operates in an active state to implement one of the plurality of logic functions, thereby providing a result of the one logic function on the output terminal.

14. The system of claim 13, further comprising a bus connected between the first and second collections of configurable logic, wherein the bus is configured to convey state data from the first collection of configurable logic to the second collection of configurable logic.

15. The system of claim 13, wherein the first collection of configurable logic resides on a first programmable logic device and the second collection of configurable logic resides on a second programmable logic device.

16. The system of claim 13, wherein the first collection of configurable logic includes a first set of memory elements configured to store state data, wherein the second collection of configurable logic includes a second set of memory element configured to store state data, and wherein the configurable-logic modification circuit includes means for loading state data from the first set of memory elements into the second set of memory elements.

17. A system comprising:
   a) a plurality of input terminals and an output terminal;
   b) a first collection of configurable logic having a first logic configuration, a first plurality of input nodes connected to respective ones of the input terminals, and a first output node selectively connected to the output terminal;
   c) a second collection of configurable logic having a second logic configuration defining a logic function, a second plurality of input nodes connected to respective ones of the first plurality of input nodes, and a second output node selectively connected to the output terminal; and
   d) means for reconfiguring the first collection of configurable logic while the second collection of configurable logic performs the logic function.

18. The system of claim 16, further comprising means for deactivating the first collection of configurable logic before reconfiguring the first collection of configurable logic.

19. The system of claim 17, further comprising means for deactivating the second collection of configurable logic and reactivating the first collection of configurable logic after reconfiguring the first collection of configurable logic.

20. A method for alternatively providing output signals from first and second collections of configurable logic to an output terminal, the method comprising:
   a) loading a first set of configuration data into the first collection of configurable logic;
   b) connecting an output node of the first collection of configurable logic to the output terminal;
   c) activating the first collection of configurable logic to perform a first logic function defined by the first set of configuration data, thereby presenting a result of the first logic function on the output terminal;
   d) loading a second set of configuration data into the second collection of configurable logic while the first collection of configurable logic performs the first logic function of (c);
   e) disconnecting the output node of the first collection of configurable logic from the output terminal;
   f) connecting an output node of the second collection of configurable logic to the output terminal; and g) activating the second collection of configurable logic to perform a second logic function defined by the second set of configuration data, thereby presenting a result of the second logic function on the output terminal.

21. The method of claim 20, further comprising connecting input terminals of the first collection of configurable logic to respective input terminals of the second collection of configurable logic.

22. The method of claim 20, further comprising loading state information from the first collection of configurable logic to the second collection of configurable logic before activating the second collection of configurable logic to perform the second logic function.

* * * * *